US 6,639,844 B1

(12) United States Patent
Liu et al.

(10) Patent No.: US 6,639,844 B1
(45) Date of Patent: Oct. 28, 2003

(54) OVERERASE CORRECTION METHOD

(75) Inventors: Zhizheng Liu, Sunnyvale, CA (US); Yi He, Sunnyvale, CA (US); Mark W. Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/099,499

(22) Filed: Mar. 13, 2002

(51) Int. Cl.$^7$ ................................. G11C 16/04
(52) U.S. Cl. .................. 365/185.3; 365/185.22; 365/185.29; 365/185.33
(58) Field of Search .................. 365/185.3, 185.22, 365/185.29, 185.33

(56) References Cited

U.S. PATENT DOCUMENTS

| | | | | | |
|---|---|---|---|---|---|
| 5,930,174 | A | * | 7/1999 | Chen et al. | 365/185.29 |
| 6,172,909 | B1 | * | 1/2001 | Haddad et al. | 365/185.19 |
| 6,331,951 | B1 | * | 12/2001 | Bautista, Jr. et al. | 365/185.22 |
| 6,456,533 | B1 | * | 9/2002 | Hamilton et al. | 365/185.22 |
| 6,493,266 | B1 | * | 12/2002 | Yachareni et al. | 365/185.22 |

* cited by examiner

Primary Examiner—David Nelms
Assistant Examiner—Connie C. Yoha

(57) ABSTRACT

A method for correcting overerasure in a multi-bit memory device. A sector of multi-bite memory cells in the device is erased and verified. After erase and verification, the over-erased memory cells are soft programmed and verified to correct for overerasure. A soft programming pulse with a $V_g$ to $V_d$ ratio ($V_g/V_d$) greater than or equal to two is used.

3 Claims, 3 Drawing Sheets

OVERERASE CORRECTION METHOD

BACKGROUND OF THE INVENTION

1. Field of the Invention

This invention relates generally to flash memory devices and in particular to flash memory devices having multi-bit flash memory cells. Even more particularly, this invention relates to a method of programming, erasing, verifying erasure and overerase correction of the bits.

2. Discussion of the Related Art

Flash memory is a type of electronic memory media that can be rewritten which can hold its contents without the consumption of power. Flash memory devices are designed to have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in place. Flash memory devices are less expensive and denser. This new category of EEPROMs has emerged as an important non-volatile memory that combines the advantages of erasable programmable read only memory (EPROM) density with EEPREOM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of transistors within a single column is connected to the same bitline. In addition, each flash cell has its stacked gate terminal connected to a different wordline, while all the flash cells in the array have their source terminals connected to a common source terminal. In operation, individual flash cells are addressed via the respective bitline and wordline using peripheral decoder and control circuitry for programming (writing), reading or erasing function.

Such a single bit stacked gate flash memory cell is programmed by applying a voltage to the control gate and connecting the source to ground and the drain to a predetermined potential above the source. A resulting high electric field across the tunnel oxide leads to a phenomenon called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons causes the cell to be programmed.

In order to erase a typical single bit stacked gate flash memory cell, a voltage is applied to the source and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region. The electrons are then extracted from the floating gate and into the source region by way of Fowler-Nordheim tunneling through the tunnel oxide. As the electrons are removed from the floating gate, the cell is erased.

In conventional single bit flash memory devices, erase verification is performed to determine whether each cell in a block or set of such cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, dual bit flash memory cells have been introduced that allow the storage of two bits of information in a single memory cell. The conventional programming and erase verification methods employed with single bit stacked gate architectures are not adequate for such dual bit devices. The dual bit flash memory structures that have been introduced do not utilize a floating gate, such as an ONO flash memory device that employs a polysilicon layer over the ONO layer for providing wordline connections. Conventional techniques do not address the characteristics associated with these types of devices. Therefore, there is an unmet need in the art for new and improved programming methods, improved erase verification methods, improved overerase correction methods and systems that ensure proper programming and erasure of data bits in a dual bit memory architecture and which account for the structural characteristics thereof.

SUMMARY OF THE INVENTION

According to the present invention, the foregoing and other objects and advantages are obtained by a method of erasing and soft programming of the normal and complementary bits of the dual bit memory device.

In accordance with an aspect of the invention, a soft programming pulse having a ratio of $V_g/V_d \geq 2$ is applied to overerased bits if the maximum soft programming pulse has not been reached.

The described method thus provides a method of overerase correction for a multi-bit flash memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

MODE(S) FOR CARRYING OUT THE INVENTION

Figure 1:
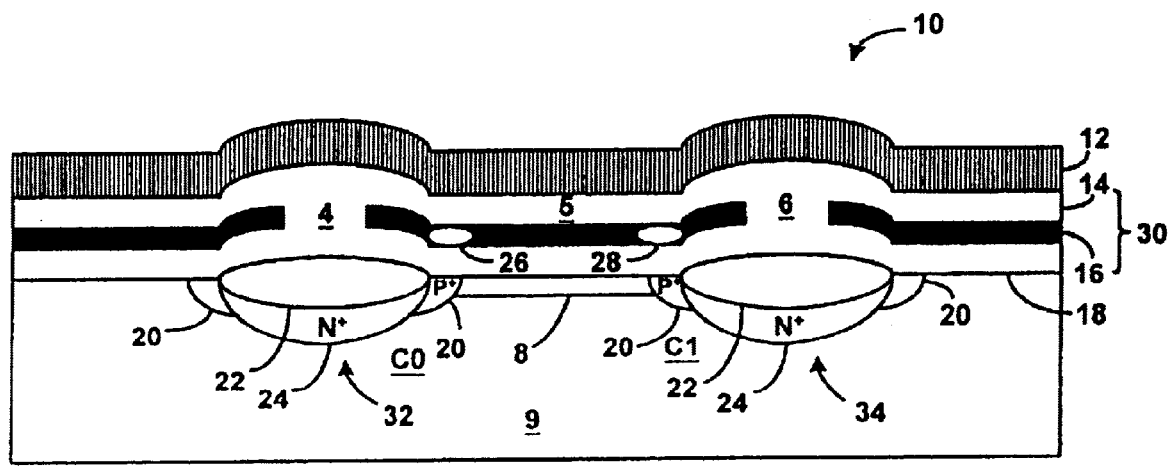
FIG. 1 is a side cross-sectional view of an exemplary dual bit memory cell in which various aspects of the present invention may be implemented.

Reference is now made in detail to a specific embodiment or specific embodiments of the present invention that illustrate the best mode or modes presently contemplated by the inventors for practicing the invention.

The following is a detailed description of the present invention made in conjunction with the attached figures in which like reference numerals refer to like elements throughout. The invention provides methodologies and a system for erasing, verifying erasure, and overerase correction of dual bit memory cells. The present invention may be used in conjunction with a chip erase or a sector erase operation in a flash memory device. Although the invention is hereinafter illustrated and described in association with an ONO (silicon oxide-silicon nitride-silicon oxide) dual bit memory cell architecture, it will be appreciated that the invention is applicable to other type architectures and other dual bit architecture usage schemes.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 may be provided on both ends of each bitline 32 and 34 where the bitlines meet the bottom silicon dioxide layer 18 or along the entire transistor. The boron core implants are more heavily doped than the P-type substrate 9 and assist in control of the VT of the memory cell 10. The cell 10 resides on a P-type substrate 9 with the conductive portion 24 of the bitlines 32 and 34 formed from an N$^+$arsenic implant, such that a channel 8 is formed across the P-type substrate 9. The memory cell 10 is a single transistor having interchangeable source and drain components formed from the N$^+$arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it should be appreciated that the bitlines 32 and 34 can be formed from a conductive portion only. Furthermore, although FIG. 1A shows gaps in the silicon nitride layer 16, it should be appreciated that the silicon nitride layer 16 may be fabricated without gaps so that the silicon nitride layer 16 would be a continuous layer.

The silicon nitride layer 16 forms a charge trapping layer. Programming of a cell is accomplished by applying voltages to the drain and the gate and grounding the source. The voltages generate electrical fields along the channel causing electrons to accelerate and jump from the substrate layer 9 into the layer 16 of nitride, which is known as hot electron injection. Since the electrons gain the most energy at the drain, these electrons become trapped and remain stored in the layer 16 of nitride near the drain. The cell 10 is generally uniform and the drain and source are interchangeable. Since the layer 16 silicon nitride is non-conducting, a first charge 26 can be injected into the nitride 16 near a first end of the central region 5 and a second charge 28 can be injected into the layer 16 of silicon nitride near a second end of the central region 5. Therefore, if the charge does not move there can be two bits per cell instead of one bit per cell.

As previously stated, the first charge 26 can be stored in the layer 16 of silicon nitride at the first end of the central region 5 and the second charge 28 can be stored at the second end of the central region 5 such that two bits can reside per memory cell 10. The dual bit memory cell 10 is generally symmetrical, thus the drain and the source are interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1.

Figure 2:
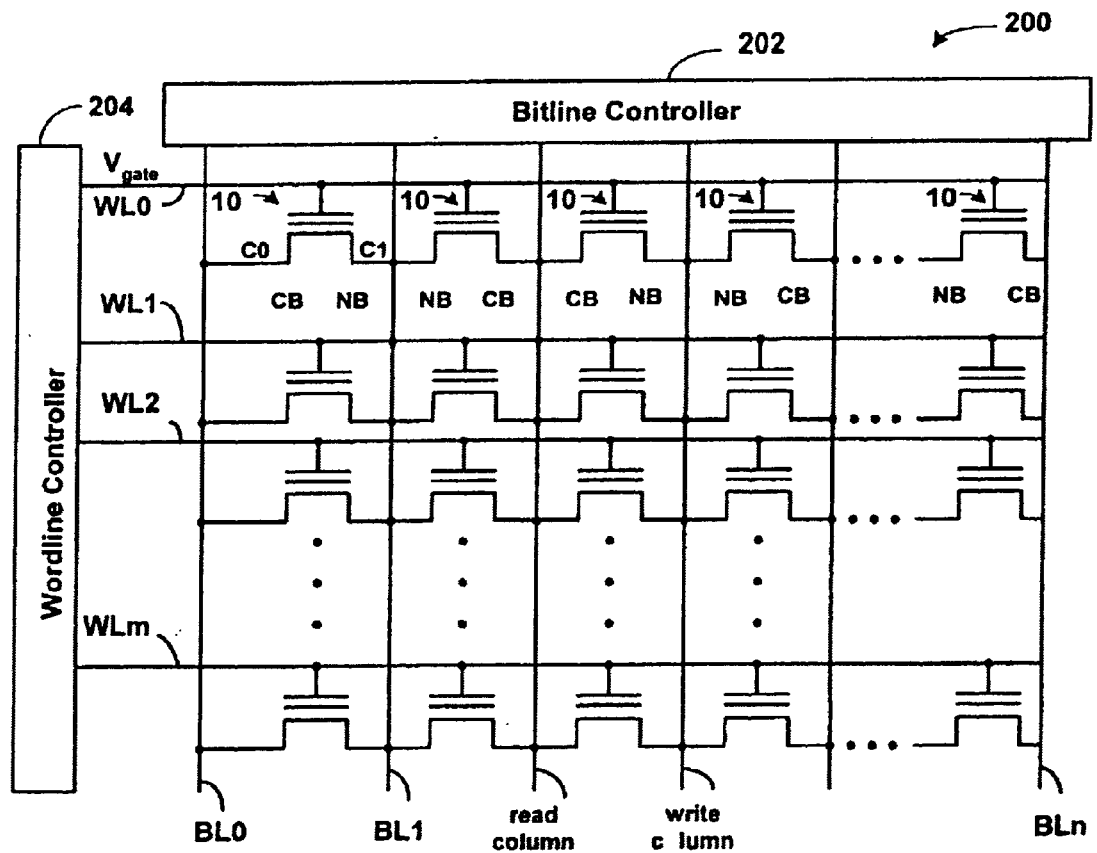
FIG. 2 is a schematic showing the interconnections of a portion of an array.

FIG. 2 and Table 1 illustrates one particular set of voltage parameters for performing reading, programming and one and two sided erases of the dual bit memory cell 10 having the first bit C0 (complimentary bit) and the second bit C1 (normal bit).

TABLE 1

| Operation | Cell | Gate | Bitline 0 | Bitline 1 | Comment |
| --- | --- | --- | --- | --- | --- |
| read | C0 | Vcc | 0 v | 1.2–2 v | complimentary bit |
| read | C1 | Vcc | 1.2–2 v | 0 v | normal bit |
| program | C0 | Vpp | 5–6 v | 0 v | hot electron |
| program | C1 | Vpp | 0 v | 5–6 v | hot electron |
| one side-erase | C0 | −6 v | 6 v | 0V | hot hole injection |
| two side-erase | All cells | −6 | 6V | 6 v | hot hole injection |

Figure 3:
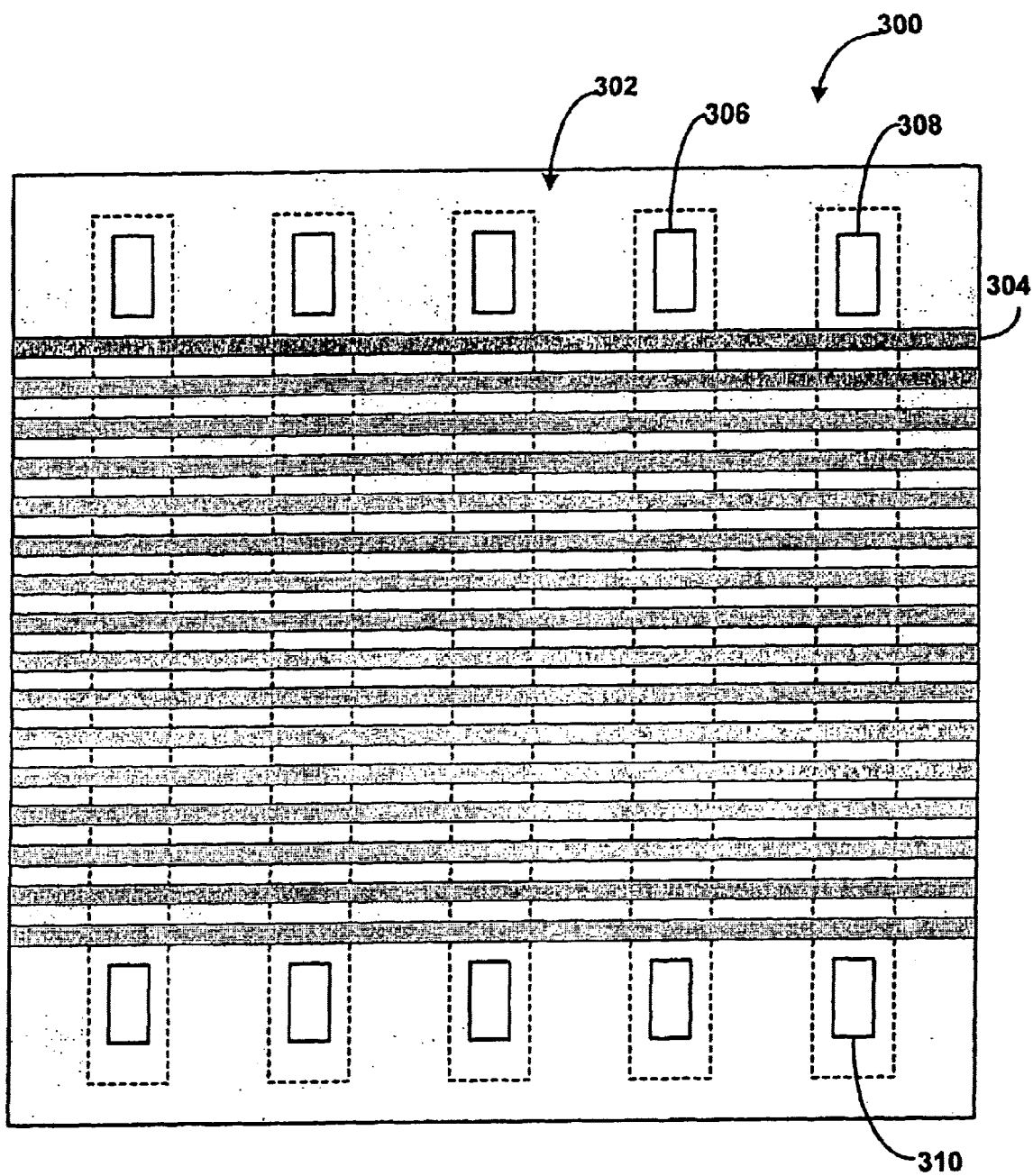
FIG. 3 illustrates a partial top view of a 64K sector of an array of dual bit flash memory having 16 words of 16 bit memory when operating in a dual bit mode.

FIG. 3 illustrates a partial memory cell layout from a top or plan view of an example of a 64K block 300. The present example is illustrated with respect to a 64K block of 8 bit IOs. It should be appreciated that blocks may be 16 bit, 32 bit, 64 bit or more IOs and are not limited to 64K (e.g., 128K, 256K, etc.). The 64K block 300 can be a sector or a portion of a sector. For example, one or more blocks with the contacts connecting common metal bitlines can form a sector.

An ONO stack strip or layer 302 extends the length of the memory array and includes the block 300. The block 300 includes 16 I/Os or groups of columns 310. Each "word" or group of I/Os is comprised of eight transistors or eight normal bits and eight complementary bits. The eight normal bits are seen by the customer and each I/O includes a polysilicon wordline 304 for addressing the rows of cells. A plurality of bitlines runs underneath the ONO stack strip layer 302 for enabling reading, writing and erasing of individual bits of the memory cells. Each bitline is connected to a first contact 308 and metal bitlines (not shown) at one end of a group of sixteen rows and a second contact 310 at the other end of the group. In the example of FIG. 3, five bitlines are illustrated such that a bitline is tied to an end of every other transistor in a column and two select transistors are used to select between four bits of two transistors for reading, writing and erasing.

Figure 4:
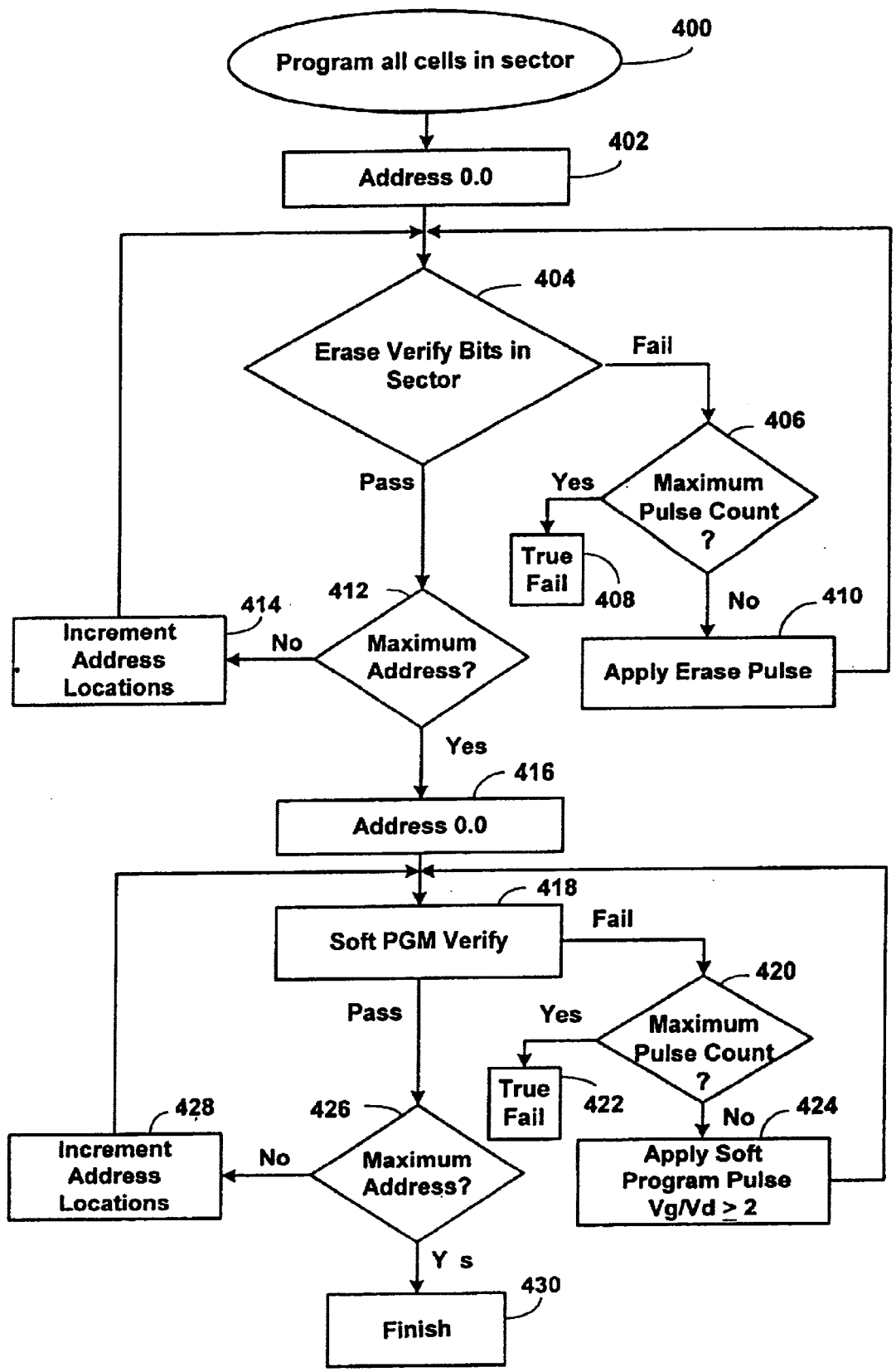
FIG. 4 is a flow diagram illustrating a methodology for erase verifying an array of dual bit memory cells and soft programming the array of dual bit memory cells in accordance with an aspect of the invention.

In view of the structure described above with respect to FIGS. 1–3 a methodology for erase of dual bit memory cells operating in multi-bit mode in accordance with one aspect of the present invention may be better appreciated with respect to the flow diagrams of FIG. 4. While, for purposes of simplicity of explanation, the methodology of FIG. 4 is shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect the present invention. The erase methodology of FIG. 4 includes a cell erase routine to control the upper and lower threshold limit of VT for a blank or erased condition (e.g., min VT=1.0V, max VT+1.8V) for a bit. Furthermore, the erase methodology includes a soft programming routine that controls the programming time by preventing over-erase of the bits that can lead to longer programming times. The soft programming can also impact the amount of charge loss after cycling.

FIG. 4 illustrates a particular methodology for performing an erase and soft programming of dual bit flash memory cells in a sector of a flash memory array. The method begins at step 400 where all cells in the sector. The method then advances to step 402 where an address counter pointing to the memory address of the array is set to address 0.0. The methodology then proceeds to step 404 where a verify erase of the bits in the sector is performed. The bit location can be a memory address of a single bit location or a memory address of an I/O or word location of the sector. If the verify erase of a bit location fails, the methodology proceeds to step 406 where it is determined if a maximum pulse count has been exceeded. If the maximum pulse count has been exceeded, a true fail occurs as indicated at 408. If the maximum pulse count has not been exceeded at 406 erase pulses are applied at 410. If the verify erase of the bit location passes, the methodology proceeds to step 512 where it is determined if the bit location is at the maximum address. If the address is not the maximum address, the address location is incremented at 414 and the methodology goes to step 404 and the methodology described above in conjunction with steps 406 through 410 repeats. If it is determined that the bit location is at the maximum address the methodology proceeds to step 416 where an address counter pointing to the memory address of the array is set to address 0.0.

The methodology then proceeds to step 418 where a soft program verify of the bits in the sector array is conducted. If the bit fails, it is determined at 420 if the maximum number of soft programming pulses has been applied to the bit. If the maximum number of soft programming pulses has been applied the bit fails as indicated at 422. If the maximum number of soft programming pulses has not been applied, soft programming pulses in the ratio of $V_g/V_d \geq 2$ are applied to the bit as indicated at 424. If it is determined at 418 that the bit passes, it is determined at 426 if the bit is at the maximum address. If the bit is not at the maximum address, the address is incremented at 428 and the methodology returns to 418. If the bit is at the maximum address, the memory array is finished 430.

In summary, the present invention provides a method of overerase correction for a dual bit memory device.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A method of overerase correction of flash memory cells in a multi-bit flash memory array, the method comprising:

(a) programming all cells in a sector;

(b) erasing and erase verifying all bits in the sector;

(c) identifying overerased bits; and (d) applying a soft programming pulse having a ratio of $V_g/V_d \geq 2$ to overerased bits.

2. The method of claim 1 wherein step (c) is accomplished by:

(e) Performing (418) a soft program verify;

(f) Determining (420) if a maximum soft programming pulse count has been reached;

(g) If the maximum soft programming pulse count has not been reached apply (424) the soft programming pulse having the ratio $V_g/V_d \geq 2$;

(h) Repeating steps (e)–(g) until it is determined at step (h) that the maximum soft programming pulse count has been reached indicating that a true failure has occurred.

3. The method of claim 1 wherein step (b) is accomplished by:

(i) performing an erase verify of bits in the sector;

(j) if a bit is not erased, determining if the maximum erase pulse count has been reached;

(k) if the maximum pulse count has not been reached applying an erase pulse;

(l) repeating steps (i)–(k) until it is determined at step (j) that the maximum erase pulse count has been reached indicating that a true failure has occurred.

* * * * *